United States Patent
Kim et al.

(10) Patent No.: US 12,525,470 B2
(45) Date of Patent: Jan. 13, 2026

(54) NOZZLE AND SUBSTRATE PROCESSING APPARATUS INCLUDING THE SAME

(71) Applicant: SEMES CO., LTD., Cheonan-si (KR)

(72) Inventors: Jae Youl Kim, Yongin-si (KR); Cheol Yong Shin, Yongin-si (KR); Jin Woo Jang, Seoul (KR)

(73) Assignee: SEMES CO., LTD., Cheonan-si (KR)

( * ) Notice: Subject to any disclaimer, the term of this patent is extended or adjusted under 35 U.S.C. 154(b) by 242 days.

(21) Appl. No.: 17/971,615

(22) Filed: Oct. 23, 2022

(65) Prior Publication Data

US 2023/0207337 A1 Jun. 29, 2023

(30) Foreign Application Priority Data

Dec. 28, 2021 (KR) .................. 10-2021-0189629

(51) Int. Cl.
*H01L 21/67* (2006.01)
*H01L 21/677* (2006.01)

(52) U.S. Cl.
CPC .... *H01L 21/67051* (2013.01); *H01L 21/6779* (2013.01)

(58) Field of Classification Search
CPC ........... H01L 21/67051; H01L 21/6779; H01L 21/6708; H01L 21/6715; H01L 21/67742; H01L 21/67017; B05B 11/02; B05C 5/02; B05C 11/10
See application file for complete search history.

(56) References Cited

U.S. PATENT DOCUMENTS

| | | | | |
|---|---|---|---|---|
| 2,134,709 A | * | 11/1938 | Drew | B05B 1/28 222/571 |
| 3,792,724 A | * | 2/1974 | Hunter | B29C 66/4322 141/286 |
| 5,756,155 A | * | 5/1998 | Tzeng | B05B 14/00 239/113 |
| 6,056,208 A | * | 5/2000 | Pirker | B67C 3/2608 239/119 |
| 10,870,118 B2 | * | 12/2020 | Sekiya | B05B 7/0475 |
| 2009/0121038 A1 | * | 5/2009 | Wurz | B05B 7/2489 239/602 |
| 2013/0255728 A1 | * | 10/2013 | Noh | B05B 13/02 134/26 |
| 2016/0240401 A1 | * | 8/2016 | Muramoto | H01L 21/6715 |
| 2017/0001127 A1 | * | 1/2017 | Yu | B01D 19/0057 |
| 2017/0170035 A1 | * | 6/2017 | Teng | B05B 13/0278 |
| 2017/0253355 A1 | * | 9/2017 | Corominas | B65B 9/042 |
| 2019/0047015 A1 | * | 2/2019 | Fukada | B05C 5/0291 |
| 2019/0189471 A1 | * | 6/2019 | Jung | H01L 21/67023 |
| 2019/0388912 A1 | * | 12/2019 | Kader | B05C 11/1039 |

(Continued)

FOREIGN PATENT DOCUMENTS

| | | | |
|---|---|---|---|
| JP | 4342343 | * | 10/2009 |
| KR | 20-0206219 | | 12/2000 |

(Continued)

*Primary Examiner* — Alexander Markoff

(57) ABSTRACT

According to an embodiment of the present disclosure, a processing liquid supply nozzle includes a nozzle body, a nozzle tip member connected to a lower portion of the nozzle body, and a fastening member that is disposed between the nozzle body and the nozzle tip member to connect the nozzle body and the nozzle tip member to each other and introduces air into the nozzle body and the nozzle tip member.

9 Claims, 6 Drawing Sheets

(56) References Cited

U.S. PATENT DOCUMENTS

2020/0122171 A1* 4/2020 Sekiya .................. D21H 23/50
2023/0207337 A1* 6/2023 Kim .................... H01L 21/6779
                                                                134/31

FOREIGN PATENT DOCUMENTS

KR   10-2011-0071840        6/2011
KR   10-2020-0082770        7/2020
KR   10-2021-0060724    *   5/2021

* cited by examiner

NOZZLE AND SUBSTRATE PROCESSING APPARATUS INCLUDING THE SAME

CROSS REFERENCE TO RELATED APPLICATION

The present application claims priority to Korean Patent Application No. 10-2021-0189627, filed Dec. 28, 2021, the entire contents of which is incorporated herein for all purposes by this reference.

BACKGROUND OF THE INVENTION

1. Field of the Invention

The present disclosure relates to a nozzle for supplying a processing liquid to a substrate and a substrate processing apparatus including the same.

2. Description of the Related Art

In general, a semiconductor device manufacturing process is made to repeatedly perform various unit processes such as a thin film deposition process, an etching process, a cleaning process, and a photo process, on a substrate such as a wafer. In some processes such as a wet cleaning process, a wet etching process, and a coating process, among the above processes, a processing liquid supply unit for supplying a processing liquid to a substrate is provided.

The processing liquid supply unit provides the substrate with a processing liquid suitable for each processing process by controlling the concentration and the temperature of the processing liquid. A substrate processing apparatus including such a processing liquid supply unit may include a spin head on which a substrate is mounted and a nozzle for discharging the processing liquid to the substrate mounted on the spin head. The nozzle is connected to a storage tank in which the processing liquid is stored, through a supply line. The supply line receives the processing liquid supplied from the storage tank and provides the processing liquid for the nozzle. The supply line may be equipped with a control valve that controls the amount of processing liquid to be supplied to the nozzle and a suck-back valve that sucks back the processing liquid remaining in the nozzle to remove the processing liquid remaining in the nozzle. When the control valve is turned off to cut off block the processing liquid supplied to the nozzle, the suck-back valve sucks back the processing liquid remaining in the nozzle to prevent an occurrence of a situation in which the processing liquid remaining in the nozzle flows out.

In recent years, A the diameter of a nozzle outlet is increased in order to increase the amount of processing liquid to be discharged, a phenomenon of dropping the processing liquid is largely increased. In addition, in a case of a processing liquid containing a surface-active ingredient or a processing liquid having low viscosity (for example, liquid organic solvent (IPA) and solution containing ozone), the surface tension is significantly reduced. For such reasons, even after sucking-back, the processing liquid in the supply line flows into the nozzle side, and is easily leaked to the outside. In particular, when an external impact is applied, a situation in which the processing liquid remaining near the outlet on a flow path of the nozzle is intermittently dropped occurs.

Meanwhile, the suck-back level may be set differently in accordance with the environment of a work line, the skill level of an operator, and the like. Depending on the set suck-back level, an air pocket phenomenon, a processing liquid formation phenomenon (for example, Taylor cone phenomenon), and the like occur, and this may cause dropping of the processing liquid.

Thus, an excessive amount of processing liquid contaminates and damages the substrate, and, if such a situation is repeated, as a result, it becomes difficult to produce a substrate having desired quality. In addition, in a case where cleaning of a substrate is performed by using a plurality of nozzles, if an undesired heterogeneous processing liquid is dropped, the substrate or the spin head may be contaminated, and cleaning efficiency may be reduced. That is, the dropping of the processing liquid consequently causes a problem of deterioration of the productivity of the substrate.

SUMMARY OF THE INVENTION

The present disclosure has been made to solve the above-described problems, and an object of the present disclosure is to provide a nozzle capable of preventing an occurrence of a processing liquid dropping situation and a substrate processing apparatus including the nozzle.

Another object of the present disclosure is to provide a nozzle for forming a stable meniscus when a supply of a processing liquid is stopped, and a substrate processing apparatus including the nozzle.

Objects of the present disclosure are not limited to those described above, and other objects not mentioned will be clearly understood by those skilled in the art from the following description.

According to an embodiment of the present disclosure, a nozzle for supplying a processing liquid to a substrate for substrate processing includes a nozzle body, a nozzle tip, and a connector disposed between the nozzle body and the nozzle tip and connecting the nozzle body to the nozzle tip. The connector includes one or more air inlets for introducing air into the nozzle body and the nozzle tip via the connector.

According to an embodiment of the present disclosure, a substrate processing apparatus includes a substrate support unit that rotates while supporting a substrate, and a processing liquid supply unit that includes a nozzle for supplying a processing liquid onto the substrate and a processing liquid supply portion that supplies the processing liquid to the nozzle. The nozzle includes a nozzle body, a nozzle tip, and a connector disposed between the nozzle body and the nozzle tip and connecting the nozzle body to the nozzle tip. The connector includes one or more air inlets for introducing air into the nozzle body and the nozzle tip via the connector.

According to an embodiment of the present disclosure, a substrate processing equipment includes a load port on which a carrier storing a substrate is mounted, an index chamber in which an index robot that conveys the substrate from the carrier mounted on the load port is provided, and a liquid processing apparatus that performs a liquid processing process on the substrate. The liquid processing apparatus includes a substrate support unit that rotates while supporting the substrate, and a processing liquid supply unit that includes a nozzle for supplying a processing liquid onto the substrate and a processing liquid supply portion that supplies the processing liquid to the nozzle. The nozzle includes a nozzle body, a nozzle tip, and a connector disposed between the nozzle body and the nozzle tip and connecting the nozzle body to the nozzle tip. The connector includes one or more air inlets for introducing air into the nozzle body and the nozzle tip via the connector to prevent dropping of the processing liquid of which a supply is stopped, from the nozzle tip.

According to the present disclosure, when the supply of the processing liquid is stopped, air is introduced into the nozzle to momentarily separate the processing liquid, so that it is possible to suck back the processing liquid. In particular, by forming a stable meniscus, it is possible to prevent an occurrence of a processing liquid dropping situation, a Taylor cone phenomenon, an air pocket phenomenon, and the like.

In addition, according to the present disclosure, it is possible to exhibit the above-described effect only by replacing only a nozzle tip without changing other components, and to exhibit the same effect regardless of the environment of a manufacturing line, the skill level of an operator, and the like.

Effects of the present disclosure are not limited thereto, and other effects not mentioned will be clearly understood by those skilled in the art from this specification and the accompanying drawings.

BRIEF DESCRIPTION OF THE DRAWINGS

The above and other objectives, features, and other advantages of the present disclosure will be more clearly understood from the following detailed description taken in conjunction with the accompanying drawings, in which.

DESCRIPTION OF EMBODIMENTS

Figure 1:
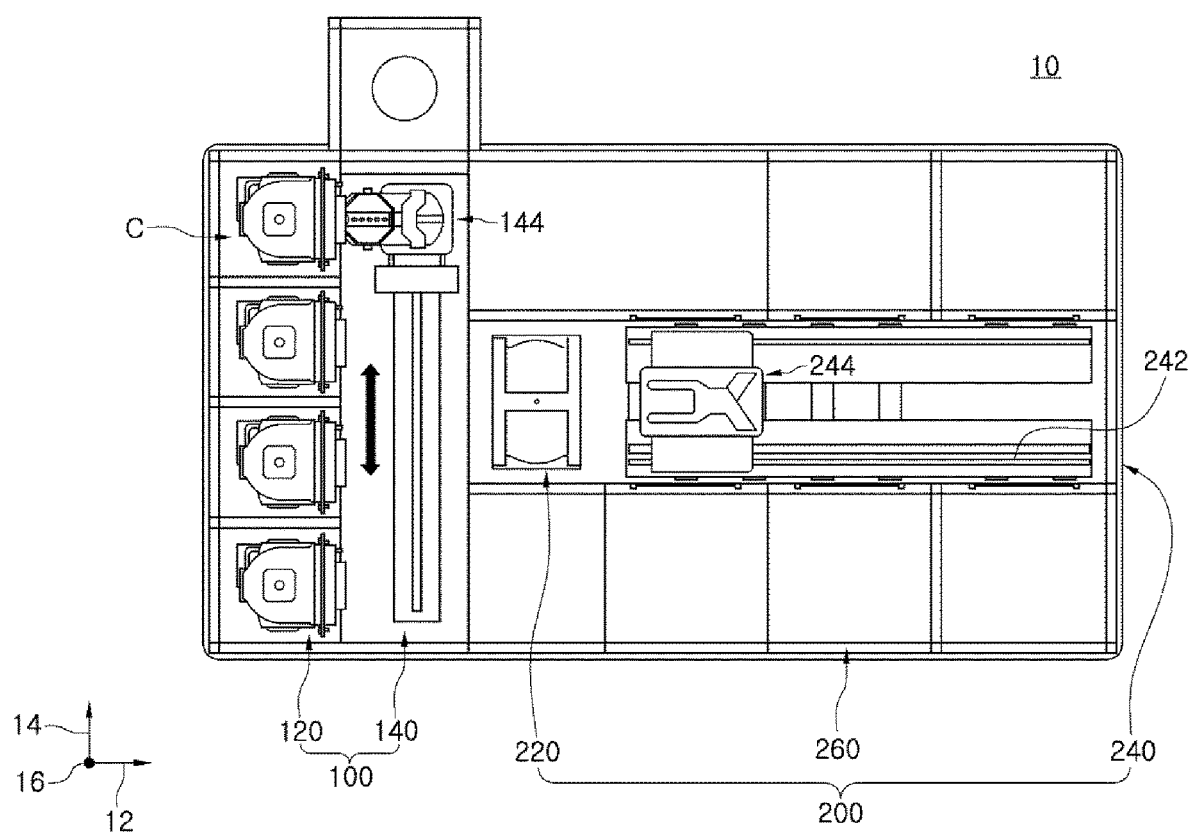
FIG. 1 illustrates an example of substrate processing equipment according to an embodiment of the present disclosure.

Hereinafter, embodiments of the present disclosure will be described in detail with reference to the accompanying drawings to be easily implemented by those skilled in the art. The present disclosure may be implemented in various different forms and is not limited to the embodiments described herein.

In describing the present disclosure, when it is decided that a detailed description of a known configuration or function related to the disclosure makes the gist of the disclosure unclear, the detailed description is omitted, and parts having similar functions and actions are denoted by the same reference signs in all drawings.

At least some of the terms used in the specification are defined in consideration of functions in the present disclosure, and thus may vary according to the user, the operator intention, the custom, and the like. Therefore, the terms should be interpreted based on the content throughout the specification.

In addition, in the specification, a sentence that a component is included means that other components may be further included, rather than excluding other components, unless otherwise stated. In addition, a sentence that a portion is "connected (or coupled) to" another portion includes not only a case of "being directly connected (coupled)" but also a case of "being indirectly connected (coupled) with other portions interposed therebetween".

Meanwhile, the size, the shape, and the line thickness of a component in the drawing may be somewhat exaggerated for convenience of understanding.

Embodiments of the present disclosure will be described with reference to schematic illustrations of ideal embodiments of the present disclosure. Accordingly, changes from the shape of the illustration, for example, changes in manufacturing methods and/or tolerances, can be sufficiently expected. Accordingly, the embodiments of the present disclosure are not to be described as being limited to the specific shapes of regions described as diagrams, but to include deviations in shape. The elements illustrated in the drawings are just schematic and their shapes are not intended to describe the precise shapes of the elements, nor intended to limit the scope of the present disclosure.

A substrate processing apparatus according to an embodiment of the present disclosure may be used to perform a liquid processing process on a substrate such as a semiconductor wafer or a flat display panel. For example, equipment in the present embodiment may be used to perform a cleaning process on a substrate. In the following description, it is assumed that the substrate processing apparatus is identical to a liquid processing apparatus.

FIG. 1 illustrates an example of substrate processing equipment according to the embodiment of the present disclosure. With reference to FIG. 1, substrate processing equipment 10 includes an index unit 100 and a process processing unit 200.

The index unit 100 may include a load port 120 and an index chamber 140. The load port 120, the index chamber 140, and the process processing unit 200 may be arranged in a line in order. A direction in which the load port 120, the index chamber 140, and the process processing unit 200 are arranged is referred to as a first direction 12 below. A direction perpendicular to the first direction 12 when viewed from the top is referred to as a second direction 14 below, and a direction perpendicular to a plane including the first direction 12 and the second direction 14 is referred to as a third direction 16 below.

A carrier C in which a substrate W is stored may be mounted on the load port 120. A plurality of load ports 120 may be provided and may be arranged in a line along the second direction 14. FIG. 1 illustrates that four load ports 120 are provided. The number of load ports 120 may increase or decrease depending on conditions such as process efficiency and footprint of the process processing unit 200. A front opening unified pod (FOUP) may be used as the carrier C.

The index chamber 140 may be located between the load port 120 and the process processing unit 200. The index chamber 140 has a rectangular parallelepiped shape including a front panel, a rear panel, and both side panels. In the index chamber 140, an index robot 144 for conveying a substrate W between the carrier C mounted on the load port 120 and a load lock chamber 220 may be provided. Although not illustrated, the index chamber 140 may include a controlled air flow system such as vents and laminar flow systems, in order to prevent introduction of particles to the internal space.

The process processing unit 200 may include the load lock chamber 220, a transport chamber 240, and a process chamber 260. The transport chamber 240 may be disposed so that the longitudinal direction of the transport chamber is parallel to the first direction 12. Process chambers 260 may be respectively disposed on one side and the other side of the transport chamber 240 in the second direction 14.

Some of the process chambers 260 may be arranged in the longitudinal direction of the transport chamber 240. Some of the process chambers 260 may be arranged to be stacked. That is, the process chambers 260 may be arranged on one side of the transport chamber 240 in an arrangement of A×B (A and B are natural numbers of 1 or more). Here, A indicates the number of process chambers 260 provided in a line in the first direction 12, and B indicates the number of process chambers 260 provided in a line in the third direction 16.

The load lock chamber 220 is disposed between the index chamber 140 and the transport chamber 240. The load lock chamber 220 provides a space for temporarily loading the substrate W before the substrate W is conveyed between the transport chamber 240 and the index chamber 140. The load lock chamber 220 may be provided with a slot (not illustrated) in which the substrate W is placed, and a plurality of slots (not illustrated) may be provided at a distance from each other in the third direction 16. In the load lock chamber 220, a surface facing the index chamber 140 and a surface facing the transport chamber 240 may be provided in an open form.

The transport chamber 240 may convey the substrate W between the load lock chamber 220 and the process chambers 260. The transport chamber 240 may be provided with a guide rail 242 and a main robot 244. The guide rail 242 is disposed so that the longitudinal direction of the guide rail is parallel to the first direction 12. The main robot 244 is installed on the guide rail 242 and is provided to be movable on the guide rail 242 along the first direction 12 in a straight line.

Components for conveying the substrate W are defined as a transport unit below. For example, the transfer unit may include the transport chamber 240 and the index chamber 140. In addition, the transfer unit may include the main robot 244 and the index robot 144 provided in the transport chamber 240.

A substrate processing apparatus that performs the liquid processing process, for example, a cleaning process, on the substrate W may be provided in the process chamber 260. For example, the cleaning process may be a process of cleaning the substrate W, stripping, and removing organic residue by using processing liquids containing an alcohol component. The substrate processing apparatus provided in each process chamber 260 may have a different structure depending on the type of cleaning process to be performed. Optionally, the substrate processing apparatus in each process chamber 260 may have the same structure. Optionally, the process chambers 260 may be classified into a plurality of groups, so that the substrate processing apparatuses provided in the process chamber 260 belonging to the same group may have the same structure, and the substrate processing apparatuses provided in the process chamber 260 belonging to different groups may have different structures. An example of the liquid processing apparatus provided in the process chamber 260 will be described below.

Figure 2:
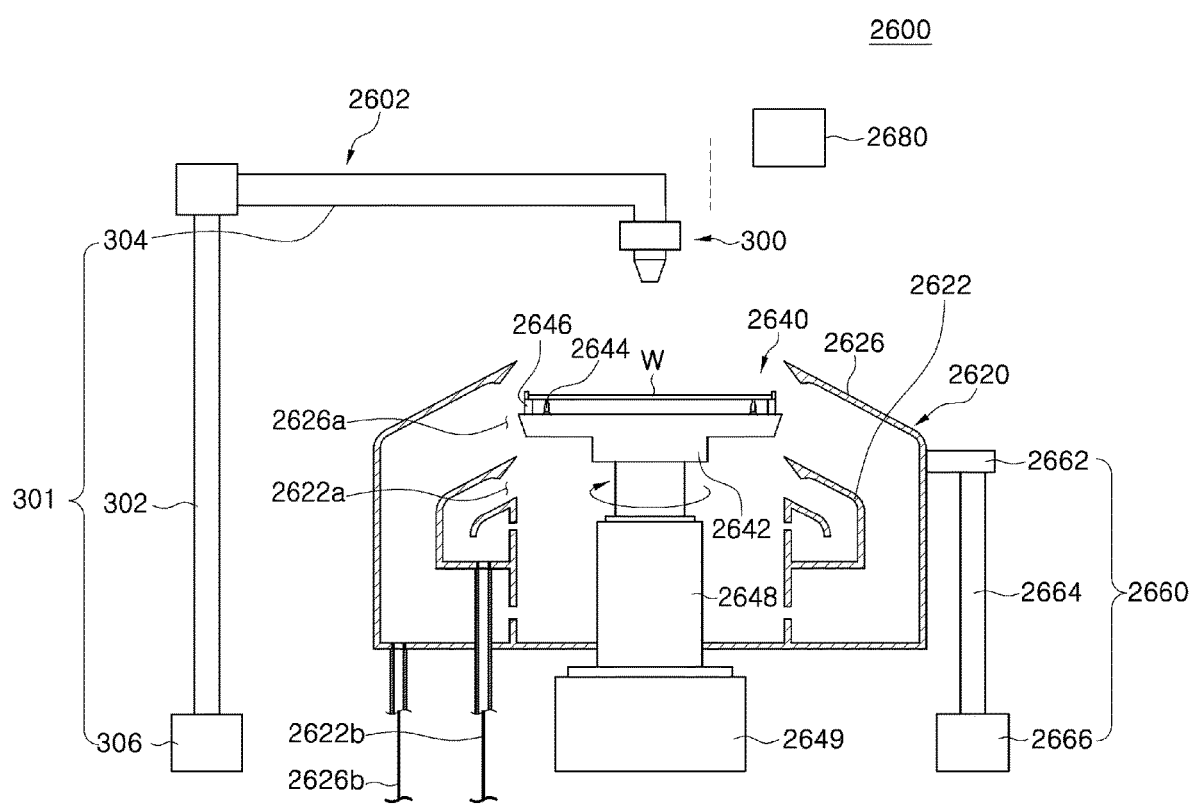
FIG. 2 illustrates an example of a substrate processing apparatus in the embodiment of the present disclosure.

FIG. 2 illustrates an example of the substrate processing apparatus in the embodiment of the present disclosure. FIG. 2 is a diagram illustrating the substrate processing apparatus provided in the process chamber 260 in FIG. 1.

With reference to FIG. 2, a substrate processing apparatus 2600 provided in the process chamber includes a processing container 2620, a substrate support unit 2640, a lifting unit 2660, and a processing liquid supply unit 2602. The liquid processing apparatus 2600 provided in the process chamber 260 may supply the processing liquid to the substrate W. For example, the processing liquid may be a developer, an etchant, a cleaning solution, a rinse solution, and an organic solvent. The etching solution or cleaning solution may be a liquid having acid or basic properties, and may contain sulfuric acid ($H_2SO_4$), phosphoric acid ($P_2O_5$), hydrofluoric acid (HF), and ammonium hydroxide ($NH_4OH$). The rinse solution may be pure water ($H_2O$). The organic solvent may be isopropyl alcohol (IPA) being a low surface tension fluid. Alternatively, the processing liquid may be a mixed solution of diluted sulfuric acid peroxide (DSP).

The processing container 2620 provides a processing space in which a substrate is processed. The processing container 2620 has a cylindrical shape with an open top. The processing container 2620 may include an outer recovery container 2626 (or a first recovery container) and an inner recovery container 2622 (or a second recovery container). The recovery containers 2622 and 2626 recover processing liquids different from each other among the processing liquids used in the process. The inner recovery container 2622 is provided in an annular ring shape surrounding the substrate support unit 2640. The outer recovery container 2626 is provided in an annular ring shape surrounding the inner recovery container 2622. An inner space 2622a of the inner recovery container 2622 functions as an inner inlet 2622a through which the processing liquid flows into the inner recovery container 2622. A space 2626a between the inner recovery container 2622 and the outer recovery container 2626 functions as an outer inlet port 2626a through which the processing liquid is introduced into the outer recovery container 2626. The inlets 2622a and 2626a may be located at different heights. Recovery lines 2622b and 2626b are connected to the bottoms of the respective recovery containers 2622 and 2626. The processing liquids introduced into the recovery containers 2622 and 2626 can be provided through the recovery lines 2622b and 2626b to an external processing fluid regeneration system (not illustrated) for reuse, respectively.

The substrate support unit 2640 supports a substrate W in the processing space. The substrate support unit 2640 may support and rotate the substrate W during a process. The substrate support unit 2640 includes a support plate 2642, a support pin 2644, a chuck pin 2646, and a rotational drive member. The support plate 2642 is provided in a substantially circular plate shape. In an embodiment, the substrate support unit 2640 may include or may be a spinner or a wafer chuck.

A plurality of support pins 2644 are provided to protrude upward from the support plate 2642 and support the rear surface of the substrate W.

A plurality of chuck pins 2646 are provided to protrude upward from the support plate 2642 and support the side portion of the substrate W. The chuck pin 2646 supports the side portion of the substrate W so that the substrate W is not laterally deviated from the correct position when the support plate 2642 is rotated. The chuck pin 2646 is provided to enable linear movement between an outer position and an inner position along the radial direction of the support plate 2642. When the substrate W is loaded or unloaded on the support plate 2642, the chuck pin 2646 is located at the outer position. When the process is performed on the substrate W, the chuck pin 2646 is located at the inner position. The inner position is a position at which the chuck pin 2646 and the side portion of the substrate W are in contact with each other. The outer position is a position at which the chuck pin 2646 and the substrate W are at a distance from each other.

The rotational drive members rotate the support plate 2642. The support plate 2642 is rotatable about the center axis by the rotational drive members. The rotational drive member includes a support shaft 2648 and a drive unit 2649. The support shaft 2648 has a cylindrical shape directed in the third direction 16. The upper end of the support shaft 2648 may be fixedly coupled to the bottom surface of the support plate 2642. The drive unit 2649 provides a driving force to rotate the support shaft 2648. The support shaft 2648 is rotated by the drive unit 2649, and the support plate 2642 is rotatable with the support shaft 2648.

The lifting unit 2660 linearly moves the processing container 2620 up and down. As the processing container 2620 moves up and down, the relative height of the processing container 2620 with respect to the support plate 2642 changes. In the lifting unit 2660, when the substrate W is loaded or unloaded on or from the support plate 2642, the processing container 2620 is lowered so that the support plate 2642 protrudes above the processing container 2620. In addition, when the process is in progress, the height of the processing container 2620 is adjusted so that the processing liquid flows into the predetermined recovery container 2622 or 2626 in accordance with the type of the processing liquid supplied to the substrate W. The lifting unit 2660 includes a bracket 2662, a moving shaft 2664, and a driving unit 2666. The bracket 2662 is fixedly installed on the outer wall of the processing container 2620, and the moving shaft 2664 moved up and down by the driving unit 2666 is fixedly coupled to the bracket 2662. Optionally, the lifting unit 2660 may move the support plate 2642 up and down.

The processing liquid supply unit 2602 supplies the processing liquid to the substrate W. A plurality of processing liquid supply units 2602 may be provided, each of the processing liquid supply units 2602 may supply a different kind of processing liquid.

The processing liquid supply unit 2602 includes a moving member 301 and a nozzle 300.

The moving member 301 moves the nozzle 300 to a process position and a standby position. Here, the process position may be a position at which the nozzle 300 faces the upper surface of the substrate W supported by the substrate support unit 2640, and the standby position may be a position at which the nozzle 300 is out of the process position.

The moving member 301 may include a support shaft 302, a nozzle arm 304, and an actuator 306. The support shaft 302 is located on one side of the processing container 2620. The support shaft 302 may have a rod shape extending in the third direction 16. The support shaft 302 is provided to be rotatable by the actuator 306.

The support shaft 302 may be provided to be movable up and down. The nozzle arm 304 may be coupled to the upper end of the support shaft 302 and extend vertically from the support shaft 302. The nozzle 300 is fixedly coupled to the end of the nozzle arm 304. As the support shaft 302 is rotated, the nozzle 300 can swing with the nozzle arm 304. The nozzle 300 may be moved to the process position and the standby position by swinging. Optionally, the nozzle arm 304 may be provided to enable forward and backward movement in the longitudinal direction of the nozzle arm 304. A path through which the nozzle 300 is moved when viewed from the top may coincide with the center axis of the substrate W at the process position.

Figure 3:
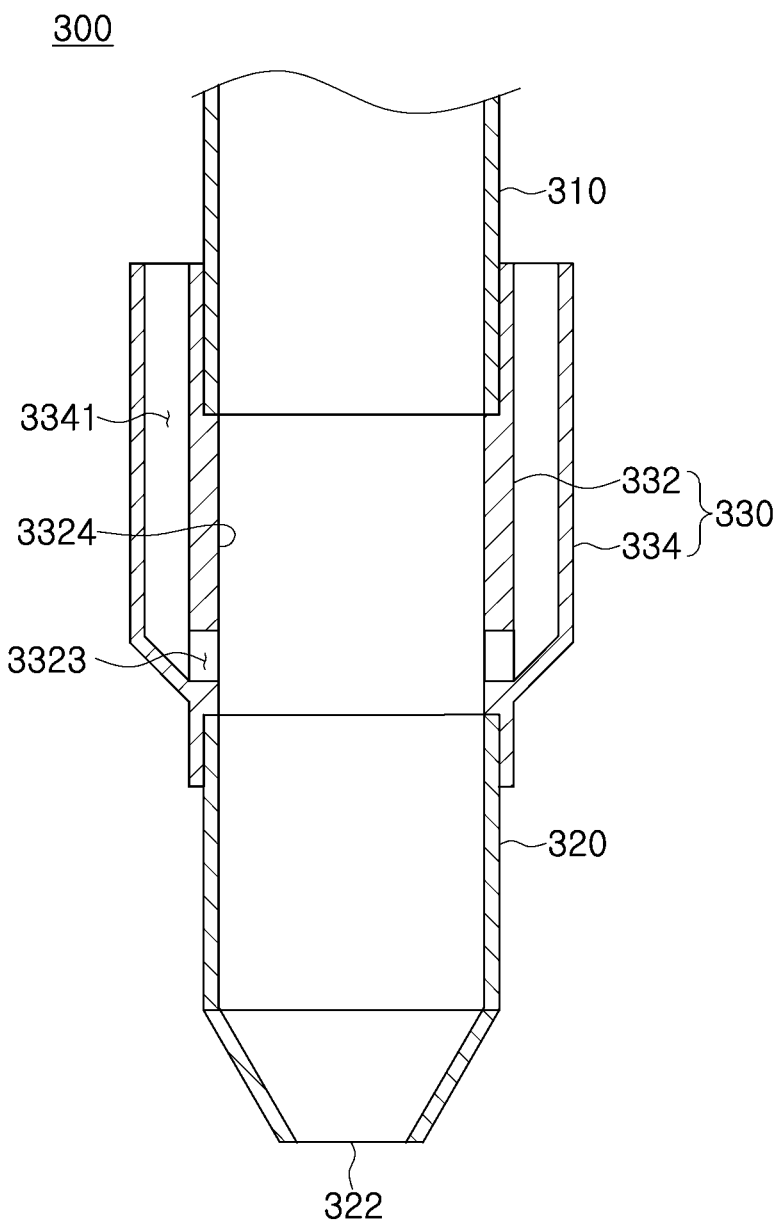
FIG. 3 is a cross-sectional view schematically illustrating a nozzle in the embodiment of the present disclosure.
Figure 4:
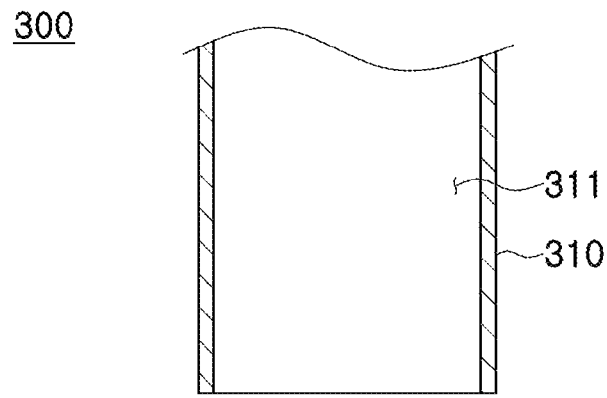
FIG. 4 is an exploded cross-sectional view schematically illustrating the nozzle in the embodiment of the present disclosure.
Figure 4:
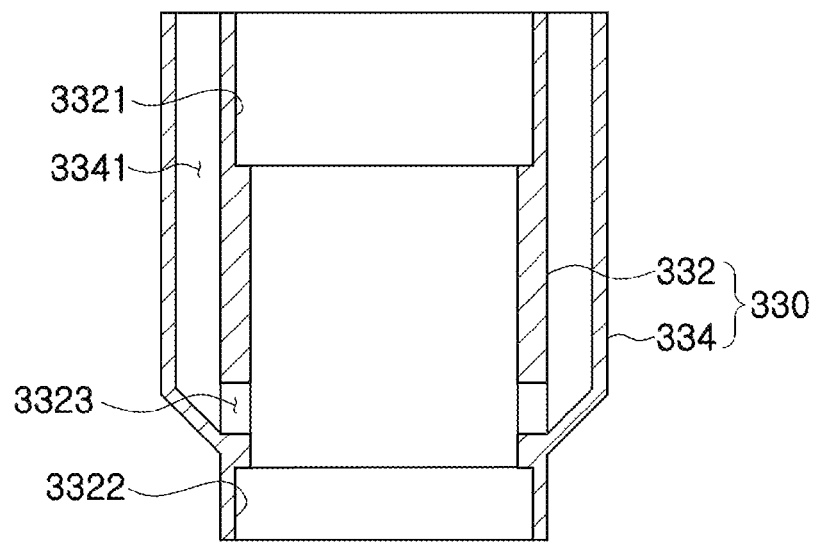
Figure 4:
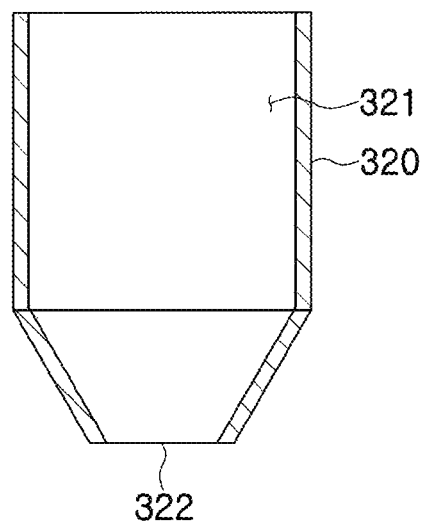
Figure 5:
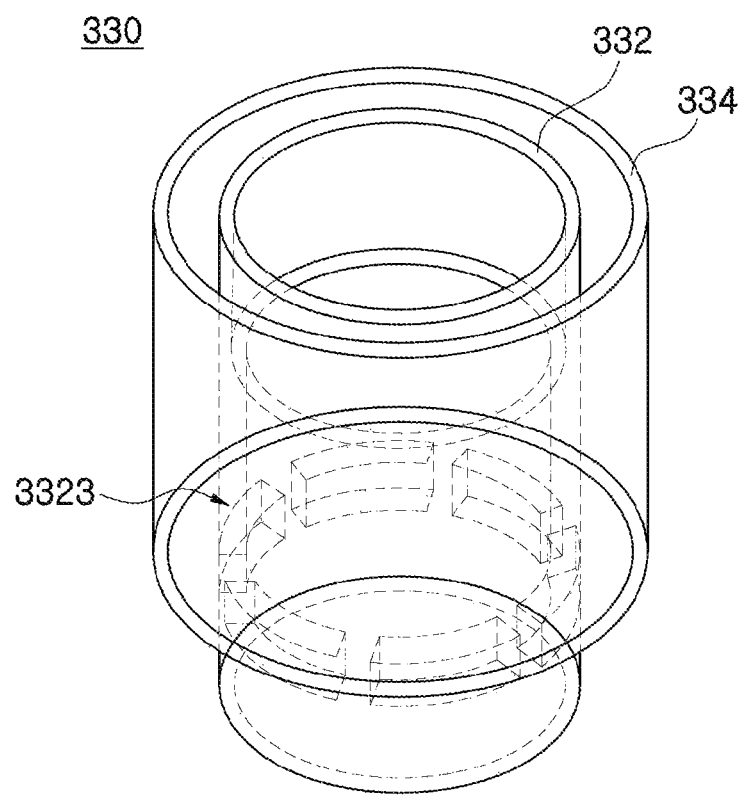
FIG. 5 is a perspective view schematically illustrating an example of a fastening member provided in the nozzle in the embodiment of the present disclosure.

FIGS. 3 to 5 are diagrams for explaining the nozzle illustrated in FIG. 2.

As illustrated in FIGS. 3 and 4, the nozzle 300 may include a nozzle body 310 supported on the nozzle arm 304, a nozzle tip member 320 (i.e., a nozzle tip) connected to the nozzle body 310, and a fastening member 330 (i.e., a connector) that connects the nozzle body 310 and the nozzle tip member 320.

The nozzle body 310 is connected to the processing liquid supply unit 2680 to form a first flow path 311 through which the processing liquid passes, thereby providing a path through which the processing liquid is supplied. The nozzle body 310 may be connected to the nozzle tip member 320 by the fastening member 330. In an embodiment, the nozzle body 310 may include a tube or a pipe through which the processing liquid flows.

The nozzle tip member 320 includes a second flow path 321 communicating with the first flow path 311 of the nozzle body 310, and an outlet 322 that communicates with the second flow path 321 and is exposed to the outside. As the nozzle tip member 320 is connected to the lower portion of the nozzle body 310 by the fastening member 330, the first flow path 311 and the second flow path 321 may communicate with each other.

The fastening member 330 may include an inner tubular member 332 (i.e., an inner tube) and an air introduction portion 334 (i.e., an outer tube).

The inner tubular member 332 includes a pipe portion 3324, a first fastening portion 3321 and a second fastening portion 3322 that are in contact with the nozzle body 310 and the nozzle tip member 320, respectively. In an embodiment, the pipe portion 3324 may have a shape of a hollow cylinder in which opposite ends are open. The pipe portion 3324 may be disposed between the first fastening portion 3321 and the second fastening portion 3322. A width of the pipe portion 3324 may be different from a width of each of the first and second fastening portions 3321 and 3322. In an embodiment, a width of the pipe portion 3324 may be greater than a width of each of the first and second fastening portions 3321 and 3322. For example, a step may be formed at the inner surface of the inner tubular member 332 by the first fastening portion 3321 and the second fastening portion 3322. Specifically, a step corresponding to the thickness of the nozzle body 310 may be formed in the first fastening portion 3321, and a step corresponding to the thickness of the nozzle tip member 320 may be formed in the second fastening portion 3322. The end portion of the nozzle body 310 may be fitted to the first fastening portion 3321, and the end portion of the nozzle tip member 320 may be fitted to the second fastening portion 3322. Thus, the first fastening portion 3321 may be in close contact with the outer surface of the nozzle body 310, and the second fastening portion 3322 may be in close contact with the outer surface of the nozzle tip member 320. That is, the first fastening portion 3321 and the nozzle body 310, and the second fastening portion 3322 and the nozzle tip member 320 may be connected to each other in a fitting manner. The areas of the first fastening portion 3321 and the second fastening portion 3322 may be adjusted as needed.

The present disclosure is not limited to such a configuration. A female thread or a male thread may be formed at the first fastening portion 3321, and a male thread or a female thread may be formed on the outer surface of the end portion of the nozzle body 310, and then the first fastening portion 3321 and the nozzle body 310 may be screw-connected to each other. In addition, a female thread or a male thread may be formed at the second fastening portion 3322, and a male thread or a female thread may be formed on the outer surface of the end portion of the nozzle tip member 320, and then the second fastening portion 3322 and the nozzle tip member 320 may be screw-connected to each other. As another example, the first fastening portion 3321 and the nozzle body 310, and the second fastening portion 3322 and the nozzle tip member 320 may be connected to each other by various methods such as clamps and latches.

The inner tubular member 332 may include an air inlet 3323. The air inlet 3323 may be formed through the side surface of the inner tubular member 332, and a plurality of air inlets 3323 may be formed at the same height between the first fastening portion 3321 and the second fastening portion 3322. Air may be introduced into the nozzle body 310 and the nozzle tip member 420 through the air inlet 3323. In an embodiment, the air inlet 3323 may be formed at the tube portion 3324. The air inlet 3324 may correspond an opening formed at the tube portion 3324 so that an air may be supplied into the inside of the pipe portion 3324. In an embodiment, the air inlet 3323 may be provided in plural as shown in FIG. 5. In an embodiment, one or more air inlets 3324 may be disposed at a region between the first fastening portion 3321 and the second fastening portion 3323, and may be disposed at the same height from the nozzle tip 3322. The outer tubular member 334 may surround the inner tubular member 332 and may be connected to the inner tubular member 332. A space between the inner tubular member 332 and the outer tubular member 334, which corresponds to the air introduction path 3341, may be connected to the one or more air inlets for supplying an air flow thereto. In an embodiment, the outer tubular member 334 may include an upper end and a lower end. The air introduction path 3341 may extends from the upper end of the outer tubular member 334 to the lower end thereof to be connected to the one or more air inlets 3323. The lower end of the outer tubular member 334 may be connected to a portion, below the one or more air inlets 3323, of the inner tubular member 332. The upper end of the outer tubular member 334 may be spaced apart from an outer side surface of the inner tubular member 332. In an embodiment, the outer tubular member 334 may include a first portion of which an inner surface is spaced apart from an outer surface of the inner tubular member 332 at a constant distance, and a second portion of which an inner surface is spaced apart from the outer surface of the inner tubular member 332 at a decreasing distance toward the lower end of the outer tubular member 334.

FIG. 5 is a perspective view schematically illustrating an example of the fastening member 330. Although FIG. 5 illustrates an example in which six rectangular air inlets 3323 are formed, the shape, the number, and the size of the air inlets 3323 may be adjusted as needed. In addition, the air inlet 3323 may be provided to be openable and closable. The arrangement (height, position, and the like) of the air inlet 3323 may also be adjusted as needed.

The air introduction portion 334 is formed so that the side surface is spaced apart from the outer surface of the inner tubular member 332 to surround the inner tubular member 332. Since the air introduction portion 334 is provided in a form in which the upper surface is opened and the lower surface is closed, the air introduction portion 334 may form an air introduction path 3341 having a form of surrounding the inner tubular member 332. The lower surface of the air introduction portion 334 may be located above the lower surface of the inner tubular member 332. The lower surface of the air introduction portion 334 may be located at a height between the lower surface of the inner tubular member 332 and the air inlet 3323. The lower surface of the air introduction portion 334 may be connected to the outer surface of the inner tubular member 332. The lower surface of the air introduction portion 334 may be formed in a shape that becomes narrower toward the bottom to induce air introduction through the air inlet 3323. The air introduced into the air introduction path 3341 through the opened upper surface of the air introduction portion 334 may be introduced into the fastening member 330 through the air inlet 3323, and then be introduced into the nozzle body 310 and the nozzle tip member 320.

Figure 6:
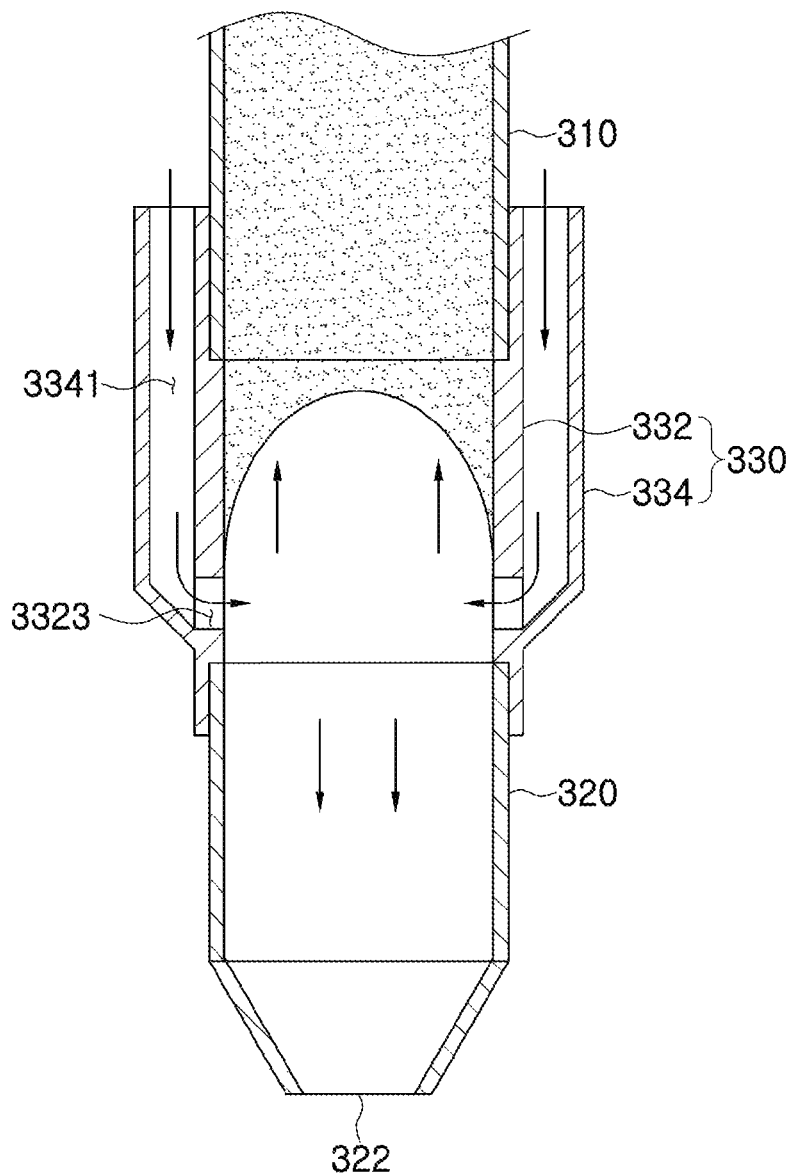
FIG. 6 is a view for explaining an operation principle of the nozzle in the embodiment of the present disclosure.

FIG. 6 is a view for explaining an operation principle of the nozzle in the embodiment of the present disclosure.

With reference to FIG. 6, the flow of air introduced into the fastening member 330 may be grasped. The air introduced into the air introduction path 3341 through the upper surface of the air introduction portion 334 may be introduced into the inner tubular member 332 through the air inlet 3323. The air introduced into the inner tubular member 332 may be introduced into the nozzle body 310 and the nozzle tip member 320 that are fastened to the inner tubular member 332 and communicate with the inner tubular member 332. Air may be normally introduced into the nozzle 300 through the air inlet 3323.

The air introduced into the nozzle 300 may not have a special role while the processing liquid is discharged. However, when the discharge of the processing liquid is stopped, the air introduced into the nozzle 300 through the air inlet 3323 may momentarily separate the processing liquid from the air inlet 3323. The air introduced into the nozzle 300 may push the processing liquid located below the air inlet 3323 to the outlet 322, so as to cause the entirety of the processing liquid to freely fall without the remaining processing liquid, and apply continuous pressure to the processing liquid located above the air inlet 3323 so as to form a stable meniscus or form a concave surface at the bottom of the remaining processing liquid. The height of the meniscus may be adjusted to a desired height by adjusting the number of opened air inlets 3323 or the size of the air inlets 3323. Thus, it is possible to prevent the occurrence of the processing liquid dropping situation and the Taylor cone phenomenon. In an embodiment, the one or more air inlets 3323 may be spaced apart from each other along a circular direction, and the outer tubular member 334 and the one or more air inlets 3323 of the inner tubular member 332 may be configured to supply the air flow into the interior of the inner tubular member 332 to form a concave surface, when a supply of the processing liquid is cut off, at a bottom of the processing liquid in the nozzle body 310 and the inner tubular member 332. The concave surface of the processing liquid may be disposed above the one or more air inlets 3323.

As described above, the nozzle 300 according to the embodiment of the present disclosure includes the fastening member 330 that fastens the nozzle body 310 and the nozzle tip member 320, and thus air (external air) can be introduced into the nozzle 300 through the air introduction portion 334 and the air inlet 3323 of the fastening member 330. When the supply of the processing liquid is stopped, the air introduced into the nozzle 300 through the fastening member 330 may momentarily separate the processing liquid, and thus can suck back the processing liquid. At this time, a stable meniscus is formed for the processing liquid located above the air inlet 3323 by the air introduced into the nozzle 300, and the processing liquid located below the air inlet 3323 is pushed out to the outlet 322 without the remaining processing liquid. Thus, it is possible to prevent the occurrence of the processing liquid dropping situation, the Taylor cone phenomenon, the air pocket phenomenon, and the like. In addition, since the above-described effect can be exhibited only by mounting the fastening member 330 including the air inlet 3323 and the air introduction portion 334 between the conventional nozzle body 310 and nozzle tip member 320, there is no need to change other components, and it is possible to exhibit the same effects regardless of the environment of the manufacturing line, the skill level of the operator, and the like.

Hitherto, the present disclosure has been described above, but the present disclosure is not limited by the disclosed embodiment and the accompanying drawings. Various modifications may be made by those skilled in the art without departing from the technical spirit of the present disclosure. In addition, the technical ideas described in the embodiment of the present disclosure may be implemented independently, or two or more may be implemented in combination with each other.

What is claimed is:

1. A nozzle for supplying a processing liquid to a substrate for substrate processing, the nozzle comprising:
   a nozzle body;
   a nozzle tip; and
   a connector detachably connected to the nozzle body and the nozzle tip and disposed between the nozzle body and the nozzle tip and connecting the nozzle body to the nozzle tip,
   wherein the connector includes one or more air inlets for introducing air into the nozzle body and the nozzle tip via the connector,
   wherein the connector includes an inner tube and an outer tube,
   wherein the inner tube includes:
      a first fastening portion;
      a second fastening portion; and
      a pipe portion disposed between the first fastening portion and the second fastening portion,
   wherein the nozzle body directly contacts an inner surface of the first fastening portion and an upper surface of the pipe portion,
   wherein the nozzle tip directly contacts an inner surface of the second fastening portion and a lower surface of the pipe portion,
   wherein the one or more air inlets are disposed at the pipe portion,
   wherein the one or more air inlets are configured to introduce air after a supply of the processing liquid is stopped, to form a stable meniscus above the one or more air inlets and prevent droplet formation,
   wherein the outer tube surrounds the inner tube and is connected to the inner tube,
   wherein a space between the inner tube and the outer tube is connected to the one or more air inlets for supplying an air flow thereto,
   wherein the outer tube includes an upper end and a lower end,
   wherein the space extends from the upper end of the outer tube to the lower end of the outer tube to be connected to the one or more air inlets,
   wherein the lower end of the outer tube is connected to a portion, below the one or more air inlets, of the inner tube,
   wherein the upper end of the outer tube is spaced apart from an outer side surface of the inner tube, and
   wherein the outer tube includes:
   a first portion of which an inner surface is spaced apart from an outer surface of the inner tube at a constant distance; and
   a second portion of which an inner surface is spaced apart from the outer surface of the inner tube at a decreasing distance toward the lower end of the outer tube.

2. The nozzle according to claim 1,
   wherein the one or more air inlets are spaced apart from each other along a circular direction.

3. The nozzle according to claim 1,
   wherein the pipe portion has a first width, the first fastening portion has a second width greater than the first width.

4. A substrate processing apparatus comprising:
   a substrate support unit that rotates while supporting a substrate; and
   a processing liquid supply unit that includes a nozzle for supplying a processing liquid onto the substrate and a processing liquid supply portion that supplies the processing liquid to the nozzle,
   wherein the nozzle includes:
      a nozzle body;
      a nozzle tip; and
      a connector detachably connected to the nozzle body and the nozzle tip and disposed between the nozzle body and the nozzle tip and connecting the nozzle body to the nozzle tip,
   wherein the connector includes one or more air inlets for introducing air into the nozzle body and the nozzle tip via the connector,
   wherein the connector includes an inner tube and an outer tube,
   wherein the inner tube includes:
      a first fastening portion;
      a second fastening portion; and
      a pipe portion disposed between the first fastening portion and the second fastening portion,
   wherein the nozzle body directly contacts an inner surface of the first fastening portion and an upper surface of the pipe portion,
   wherein the nozzle tip directly contacts an inner surface of the second fastening portion and a lower surface of the pipe portion,
   wherein the one or more air inlets are disposed at the pipe portion,
   wherein the one or more air inlets are configured to introduce air after a supply of the processing liquid is stopped, to form a stable meniscus above the oner or more air inlets and prevent droplet formation,
   wherein the outer tube surrounds the inner tube and is connected to the inner tube,
   wherein a space between the inner tube and the outer tube is connected to the one or more air inlets for supplying an air flow thereto,
   wherein the outer tube includes an upper end and a lower end,
   wherein the space extends from the upper end of the outer tube to the lower end of the outer tube to be connected to the one or more air inlets,
   wherein the lower end of the outer tube is connected to a portion, below the one or more air inlets, of the inner tube,
   wherein the upper end of the outer tube is spaced apart from an outer side surface of the inner tube, and
   wherein the outer tube includes:
   a first portion of which an inner surface is spaced apart from an outer surface of the inner tube at a constant distance; and a second portion of which an inner surface is spaced apart from the outer surface of the inner tube at a decreasing distance toward the lower end of the outer tube.

5. The substrate processing apparatus according to claim 4,
wherein the one or more air inlets are spaced apart from each other along a circular direction.

6. The substrate processing apparatus according to claim 4,
wherein the pipe portion has a first width, the first fastening portion has a second width different from the first width.

7. A substrate processing equipment comprising:
a load port on which a carrier storing a substrate is mounted;
an index chamber in which an index robot that conveys the substrate from the carrier mounted on the load port is provided; and
a liquid processing apparatus that performs a liquid processing process on the substrate,
wherein the liquid processing apparatus includes
a substrate support unit that rotates while supporting the substrate, and
a processing liquid supply unit that includes a nozzle for supplying a processing liquid onto the substrate and a processing liquid supply portion that supplies the processing liquid to the nozzle,
wherein the nozzle includes:
a nozzle body;
a nozzle tip; and
a connector disposed between the nozzle body and the nozzle tip and connecting the nozzle body to the nozzle tip, and
wherein the connector includes an inner tube and an outer tube,
wherein the inner tube includes:
a first fastening portion;
a second fastening portion; and
a pipe portion disposed between the first fastening portion and the second fastening portion,
wherein the connector includes one or more air inlets for introducing air into the nozzle body and the nozzle tip via the connector to prevent dropping of the processing liquid of which a supply is stopped, from the nozzle tip,
wherein the one or more air inlets are configured to introduce air after a supply of the processing liquid is stopped, to form a stable meniscus at the nozzle tip above the oner or more air inlets and prevent droplet formation,
wherein the first fastening portion is connected to the nozzle body,
wherein the second fastening portion is connected to the nozzle tip,
wherein the one or more air inlets are disposed at a region between the first fastening portion and the second fastening portion,
wherein the outer tube surrounds the inner tube and is connected to the inner tube,
wherein a space between the inner tube and the outer tube is connected to the one or more air inlets for supplying an air flow thereto,
wherein the outer tube includes an upper end and a lower end,
wherein the space extends from the upper end of the outer tube to the lower end of the outer tube to be connected to the one or more air inlets,
wherein the lower end of the outer tube is connected to a portion, below the one or more air inlets, of the inner tube,
wherein the upper end of the outer tube is spaced apart from an outer side surface of the inner tube, and
wherein the outer tube includes:
a first portion of which an inner surface is spaced apart from an outer surface of the inner tube at a constant distance; and
a second portion of which an inner surface is spaced apart from the outer surface of the inner tube at a decreasing distance toward the lower end of the outer tube.

8. The substrate processing equipment according to claim 7,
wherein the one or more air inlets are spaced apart from each other along a circular direction.

9. The substrate processing equipment according to claim 7,
wherein the first fastening portion contacts an outer surface of the nozzle body, and
wherein the second fastening portion contacts an outer surface of the nozzle tip.

* * * * *